3,502,598

PIEZOELECTRIC CERAMICS

Tsuneharu Nitta, Osaka-fu, Kaneomi Nagase, Kyoto-fu, and Shigeru Hayakawa, Osaka-fu, Japan, assignors to Matsushita Electric Industrial Company Limited, Osaka, Japan No Drawing. Filed July 17, 1967, Ser. No. 653,604
Claims priority, application Japan, Aug. 11, 1966, 41/53,118; Apr. 3, 1967, 42/21,690, 42/21,689; Apr. 18, 1967, 42/25,643
Int. Cl. H01v *7/02;* C04b *35/00;* H03h *9/00*
U.S. Cl. 252—62.9 2 Claims

ABSTRACT OF THE DISCLOSURE

Piezoelectric ceramics having a low dielectric constant, high Curie point, and a small temperature coefficient of resonant frequency over a wide temperature range consist, according to this invention, of a single phase solid solution composed essentially of

| | Mol percent |
|---|---|
| Sodium oxide | 33.3–54.95 |
| Lithium oxide | 0.05–21.70 |
| and | |
| Niobium oxide | 44.4–49.95 |

This invention relates to novel ceramic materials for piezoelectric transducers and more particularly to novel piezoelectric ceramic compositions comprising sodium oxide, lithium oxide and niobium oxide.

The electronic industry has recently required piezoelectric materials suitable for making electromechanical transducers operating at high frequency, for example in a megacycle range of 20–200 mc. It is important for making such transducers that the piezoelectric materials have a high piezoelectric activity, a low dielectric constant, and a small temperature dependency of electromechanical coupling coefficient.

The conventionally known piezoelectric materials, such as quartz and Rochelle salt, are monocrystalline. However, the occurrence of natural good-quality quartz is decreasing year by year, and synthetic quartz is considerably expensive. On the other hand, while Rochelle salt is quite inexpensively available, it is not heat resistant and therefore has a narrow working temperature range. In addition, these conventional materials are disadvantageous for use in electromechanical transducers because of the necessity of cutting along a certain crystal axis.

In contrast to the monocrystalline piezoelectric materials, piezoelectric polycrystalline materials are advantageous, being readily configured into desired shape and being suitable for mass production with relative ease.

However, conventional piezoelectric ceramics such as lead titanate-zirconate are usually bound up with a high dielectric constant and are not suitable for use in high frequency transducers in the afore-indicated megacycle range. As the capacitance of the transducer increases, the inductance for resonance should be decreased. However, in the high frequency resonating circuit, the inductance must be extremely low unless the capacitance of the transducer is kept low. In order to realize a low capacitance, it is necessary to reduce the cros-sectional area of the cermaic element or to increase the thickness thereof. However, changing only the size of the ceramic element is not desirable in view of the resultant decrease in band width, energy loss from the transmission line due to diffraction effects, etc. Therefore, the ideal solution for problems due to high capacitance is to use a cermaic of low dielectric constant.

Accordingly, a principal object of the present invention is to provide novel piezoelectric materials in the form of ceramics having dielectric constants much lower than those of the conventional piezoelectric ceramics.

A further object of the present invention is to provide piezoelectric ceramics characterized by low dielectric constant, high Curie point, high radial coupling coefficient, and small temperature coefficient of resonant frequency over a wide temperature interval. (Measurement of piezoelectric properties was made by the IRE standard circuit, and radial coupling coefficient was determined by the resonant to antiresonant frequency method.)

These and other objects of this invention will become apparent upon consideration of the following detailed description.

In accordance with the present invention, it has been discovered that ceramic material of a single phase solid solution composed essentially of 33.3–54.95 mol percent of sodium oxide, 0.05–21.70 mol percent of lithium oxide and 44.4–50 mol percent of niobium oxide has a low dielectric constant, a high radial coupling coefficient and a small temperature dependence of resonant frequency over a wide temperature interval.

The component oxides are intimately mixed in the desired composition proportions and fired in accordance with a schedule set forth hereinafter for production of a fired ceramic body.

The raw materials for the ceramic are reagent-grade sodium carbonate ($Na_2Co_3$), a high purity lithium carbonate ($Li_2CO_3$) and a commercially pure grade niobium pentoxide ($Nb_2O_5$). Any compound which is converted to the corresponding sodium oxide, lithium oxide or niobium oxide upon firing can be used as raw material. Batches are ball milled with a small amount of methyl alcohol for intimate mixing and then dried. Usually, they are pressed loosely into pellet form and calcined at 1000° C. for 6 hours in a covered alumina crucible. The calcined product is then powdered thoroughly and a few drops of distilled water are added to the powder. The powder is pressed at 750 kg./cm.$^2$ into the form of discs. These discs are fired at a temperature ranging from 1180° C. to 1320° C. in air for 2 hours. A temperature rising rate of 5° C. per minute is maintained. After soaking at 1180° C. to 1320° C. for 2 hours, they are cooled at "furnace power off."

Silver paste is fired on the disc surfaces to form electrodes in per se conventional manner. The disc are polarized by applying D.C. (direct current) voltage while immersed in silicone oil at 100° C. A polarizing field of the order of 4 to 5 kilovolts per millimeter is applied to the discs for 30 minutes. The discs are then cooled to room temperature (about 15° to about 30° C.) while applying a D.C. field.

The foregoing procedure is followed in connection with each of the compositions hereinafter enumerated.

TABLE I

| Composition (mol percent) | | | Electrical Property | |
|---|---|---|---|---|
| $Na_2O$ | $Li_2O$ | $Nb_2O_5$ | Dielectric constant | Radial coupling coefficient |
| 50 | 0 | 50 | 262 | 0.092 |
| 49.95 | 0.05 | 50 | 203 | 0.191 |
| 49 | 1 | 50 | 190 | 0.19 |
| 48 | 2 | 50 | 184 | 0.20 |
| 47 | 3 | 50 | 182 | 0.23 |
| 46 | 4 | 50 | 185 | 0.26 |
| 45 | 5 | 50 | 215 | 0.29 |
| 44 | 6 | 50 | 285 | 0.31 |
| 43 | 7 | 50 | 321 | 0.32 |
| 40 | 10 | 50 | 253 | 0.25 |
| 36 | 14 | 50 | 118 | 0.21 |
| 34 | 16 | 50 | 110 | 0.20 |
| 33.3 | 16.7 | 50 | 105 | 0.20 |
| 32 | 18 | 50 | 102 | 0.14 |

Referring to Table I, variation in the room temperature dielectric constant and radial coupling coefficient of piezoelectric elements employing the ceramic materials in accordance with the present invention are shown as a function of the compositions. The maximum value of the dielectric constant and of the radial coupling coefficient are observed in the ceramics of a single phase solid solution composed of 43 mol percent of sodium oxide, 7 mol percent of lithium oxide and 50 mol percent of nobium oxide. After firing, the ceramic specimens are analyzed with a Geiger-counter type X-ray diffractometer using CuKα radiation. From such tests, it is confirmed that all the ceramic specimens of the composition within a range as shown in Table II consist of a single phase solid solution with orthorhombic symmetry.

TABLE II

| | Preferable mol percent |
|---|---|
| $Na_2O$ | 33.30–49.95 |
| $Li_2O$ | 0.05–16.70 |
| $Nb_2O_5$ | 50.00 |

These compositions shown in Table II are suitable for use at high frequency in view of the small dielectric constant and the high radial coupling coefficient. For instance, the composition comprising 46 mol percent of sodium oxide, 4 mol percent of lithium oxide and 50 mol percent of niobium oxide shows a dielectric constant of 185. In the compositions comprising less than 33.3 mol percent of sodium oxide, more than 16.7 mol percent of lithium oxide and 50 mol percent of niobium oxide, there appears another phase with hexagonal symmetry in addition to the orthorhombic phase. The fired body existing in such two phases shows a poor piezoelectricity. The compositions comprising more than 49.95 mol percent of sodium oxide, less than 0.05 mol percent of lithium oxide and 50 mol percent of niobium oxide exist in an antiferroelectric phase with orthorhombic symmetry and can hardly exhibit a desirable piezoelectricity.

It is further discovered according to the present invention that the following compositions indicated in Table III can exhibit a lower dielectric constant than that of the above mentioned compositions as shown in Table II.

TABLE III

| | Preferable mol percent |
|---|---|
| $Na_2O$ | 3.33–54.95 |
| $Li_2O$ | 0.05–21.70 |
| $Nb_2O_5$ | 45.0–49.95 |

The compositions shown in Table III gives a single phase solid solution in a rhombohedral symmetry and show ferroelectricity at room temperature. The ceramic specimens of these compositions show the dielectric constant within a range of 100 to 80 while the radial coupling coefficient still remains at a relatively high value, as 0.20 to 0.34. The room temperature dielectric constant and radial coupling coefficient of piezoelectric elements employing the ceramic materials in accordance with the present invention are shown as a function of compositions in Table IV.

TABLE IV

| Composition (mol percent) | | | Electrical property | |
|---|---|---|---|---|
| $Na_2O$ | $Li_2O$ | $Nb_2O_5$ | Dielectric Constant | Radial coupling coefficient |
| 44.00 | 6.00 | 50.00 | 285 | 0.31 |
| 43.78 | 6.47 | 49.75 | 98 | 0.32 |
| 43.12 | 7.88 | 49.00 | 86 | 0.34 |
| 41.36 | 11.64 | 47.00 | 94 | 0.34 |
| 40.48 | 13.52 | 46.00 | 100 | 0.28 |
| 38.75 | 17.25 | 44.00 | 84 | 0.13 |

Table IV shows that the compositions within a range of Table III can exhibit an excellent piezoelectricity.

Moreover, according to this invention, a remarkably lower dielectric constant can be obtained by employing the compositions shown in Table V.

TABLE V

| | Preferable mol percent |
|---|---|
| $Na_2O$ | 3.33–54.95 |
| $Li_2O$ | 0.05–21.70 |
| $Nb_2O_5$ | 4.44–45.0 |

The compositions shown in Table V give a single phase solid solution with rhombohedral symmetry and show ferroelectricity. Table VI shows the room temperature dielectric constant and radial coupling coefficient of the piezoelectric ceramic materials according to this embodiment of the present invention.

TABLE VI

| Composition | | | Electrical property | |
|---|---|---|---|---|
| $Na_2O$ | $Li_2O$ | $Nb_2O_5$ | Dielectric constant | Radial coupling coefficient |
| 44.00 | 6.00 | 50.00 | 285 | 0.31 |
| 44.00 | 11.00 | 45.00 | 103 | 0.27 |
| 42.3 | 12.9 | 44.8 | 91 | 0.28 |
| 48.9 | 6.7 | 44.4 | 82 | 0.38 |
| 47.0 | 11.0 | 42.0 | 83 | 0.13 |

The compositions within the range of Table V show a lower dielectric constant and a relatively high radial coupling coefficient.

Another important property contributing to the usefulness of the piezoelectric materials according to the present invention is that their Curie points are on the high temperature side and the temperature coefficient of resonant frequency is small over a wide temperature range.

Table VII shows the Curie points and the temperature coefficients of resonant frequency for the ceramic materials of single phase solid solution in accordance with the present invention.

TABLE VII

| No. | Composition (mol percent) | | | Crystal at 25° C. | Curie point (° C.) | Temperature coefficient of fr(−40° C. to +260° C.) (percent) $\left[\left(\frac{fr(260° C.)-fr(-40° C.)}{fr(-40° C.)}\right)\times 100\right]$ |
|---|---|---|---|---|---|---|
| | $Na_2O$ | $Li_2O$ | $Nb_2O_5$ | | | |
| 1 | 48 | 2 | 50 | O | 345 | −1.20 |
| 2 | 46 | 4 | 50 | O | 390 | −0.85 |
| 3 | 45 | 5 | 50 | O | 410 | −1.12 |
| 4 | 44 | 6 | 50 | O | 420 | −0.76 |
| 5 | 42 | 8 | 50 | O | 436 | −0.43 |
| 6 | 39 | 11 | 50 | O | 442 | −0.45 |
| 7 | 45.8 | 6.3 | 47.9 | R | 470 | −0.18 |
| 8 | 46.7 | 6.4 | 46.9 | R | 360 | −0.19 |
| 9 | 41.36 | 11.64 | 46.0 | R | 480 | −0.21 |
| 10 | 42.2 | 9.8 | 48.0 | R | 372 | −0.32 |

O: Orthorhombic. R: Rhombohedral.

As seen in Table VII, the Curie points of the compositions in accordance with the present invention are in a relatively high temperature range of 320° C. to 480° C. and the temperature coefficients of the resonant frequency is less than 1.8% over the wide temperature range of −40° C. to 260° C.

The piezoelectric compositions according to the present invention can be used for making electromechanical transducers for high frequency use, for example, solid ultrasonic delay lines and filters.

Having thus disclosed the invention, what is claimed is:

1. A piezoelectric ceramic composition consisting essentially of a solid solution of

| | Mol percent |
|---|---|
| Sodium oxide | 33.3–54.95 |
| Lithium oxide | 0.05–21.70 |
| and | |
| Niobium oxide | 44.4–49.95 |

2. A composition according to claim 1 wherein the niobium oxide ranges from 4.4 to 45.0 mol percent.

References Cited

UNITED STATES PATENTS 2,864,713 12/1958 Lewis ---------- 106—39

OTHER REFERENCES

Cape K: "Dissertation Abstracts," vol. 22, p. 3562 (1962).

Krainik: "Chemical Abstracts," vol. 53, p. 5792e (1959).

HELEN M. McCARTHY, Primary Examiner

J. COOPER, Assistant Examiner

U.S. Cl. X.R.

106—39